United States Patent [19]

Lyden

[11] Patent Number: 5,189,419
[45] Date of Patent: Feb. 23, 1993

[54] SINGLE SHOT SIGMA-DELTA ANALOG TO DIGITAL CONVERTER

[75] Inventor: Colin Lyden, Baltimore, Ireland

[73] Assignee: University College Cork, Cork, Ireland

[21] Appl. No.: 702,337

[22] Filed: May 20, 1991

[30] Foreign Application Priority Data

May 21, 1990 [IE] Ireland .................................. 1815/90

[51] Int. Cl.⁵ ............................................. H03M 3/02
[52] U.S. Cl. ..................................... 341/143; 341/155
[58] Field of Search ................................ 341/143, 155

[56] References Cited

U.S. PATENT DOCUMENTS

| | | | |
|---|---|---|---|
| 4,616,349 | 10/1986 | Shirley | 341/143 |
| 4,692,719 | 9/1987 | Whigham | 341/143 |
| 4,851,841 | 7/1989 | Sooch | 341/143 |
| 4,945,359 | 7/1990 | Yamakido | 341/143 |
| 4,999,625 | 3/1991 | Thompson | 341/118 |
| 5,028,924 | 7/1991 | Thompson | 341/118 |

OTHER PUBLICATIONS

J. Robert et al., "A 16-Bit Low-Voltage CMOS A/D Converter", IEE Journal of Solid-State Circuits, vol. sc-22, No. 2, Apr. 1987.

J. Robert et al., "A Second-Order High-Resolution Incremental A/D Converter with Offset and Charge Injection Compensation", IEE Journal of Solid-State Circuits, vol. 23, No. 3, Jun. 1988.

Primary Examiner—A. D. Pellinen
Attorney, Agent, or Firm—Jacobson, Price, Holman & Stern

[57] ABSTRACT

A sigma-delta analog to digital converter 1 is disclosed. The digital filter comprises digital integrators (8, 10) for reception of the negative feedback signal of the analog modulator. The digital integrators (8, 10) are connected to replicate processing of the feedback signal by the analog integrators (3, 5). Accordingly, the digital filter and the analog modulator may be reset simultaneously so that there is no time lag between conversion cycles. Thus, single shot operation is achieved.

7 Claims, 4 Drawing Sheets

SINGLE SHOT SIGMA-DELTA ANALOG TO DIGITAL CONVERTER

INTRODUCTION

The invention relates to analog to digital converters and more particularly to sigma-delta analog to digital converters.

PRIOR ART

Such converters comprise an analog modulator, the output of which is connected to a digital filter. The analog modulator includes a series of typically two or three analog integrators, although there may be only one or more than three. The analog modulator over-samples an incoming analog signal and generates a serial digital modulated signal at a frequency determined by the over-sampling clock frequency. This is both fed to the digital filter, and is used for negative feedback in the analog modulator. The modulated signal is processed by the digital filter which eliminates high frequency components to generate a parallel digital output signal at a lower rate.

In presently available converters, the digital filter is a separate processor which simply receives the modulated signal and carries out processing and storing functions to generate the digital output signal. Because the filter has a memory of previous inputs, there can be a delay of up to 0.1 second for the processing of an independent new input. Such a delay is of little consequence for applications such as a domestic stereo sound system. However, in some applications such as in multiplexing where there would be no relationship between different signals, such a delay is unacceptable because it leads to considerable delays in operation of the multiplexer. A further problem with presently available digital filters is that they are complex and expensive as they are designed to model or approximate the analog signal by removing the high frequency part of the modulated signal.

OBJECTS

The invention is directed towards providing a sigma-delta analog to digital converter to overcome these problems.

SUMMARY OF THE INVENTION

According to the invention, there is provided a sigma-delta analog to digital converter comprising:
an analog modulator for generation of a digital modulated signal, the analog modulator comprising a series of at least one analog integrator and an associated reset circuit and a negative feedback loop; and
a digital filter for generation of an output digital signal once per conversion cycle, the digital filter being connected to the output of the analog modulator and comprising a resettable filter means for replicating processing of the feedback signal by at least the first analog integrator.

BRIEF DESCRIPTION OF THE DRAWINGS

The invention will be more clearly understood from the following description of some preferred embodiments thereof, given by way of example only with reference only to the accompanying drawings in which.

DETAILED DESCRIPTION OF THE PREFERRED EMBODIMENTS

Figure 1:
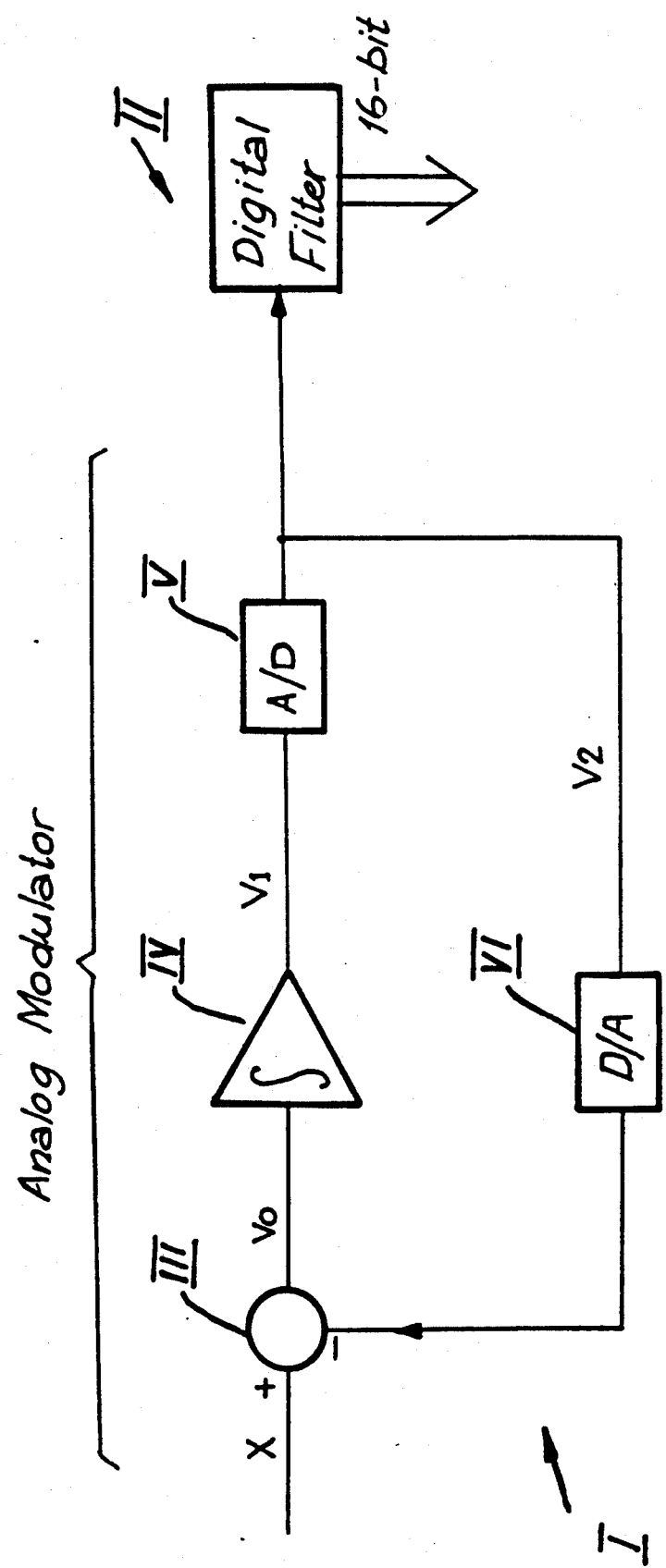
FIG. 1 is a diagram of a sigma-delta analog to digital converter of the prior art.

Referring to the drawings, and initially to FIG. 1 there is illustrated a typical first order sigma-delta analog to digital converter of the prior art. The converter comprises an analog modulator I connected to a digital filter II. The analog modulator I comprises a summing junction III connected to an analog integrator IV, the output of which is connected to an A/D converter V which provides a serial digital modulated signal. The modulated signal is fed back to a D/A converter VI which provides negative feedback into the summing junction III.

In operation, the analog integrator IV acts as an accumulator, the output of which is converted to a reference voltage (typically $+/- 1V$) resulting in a positive or a negative value for the modulated signal. The over-sampling frequency is determined by the clock frequency and the modulated signal is a one-bit data stream at this frequency. The digital filter II receives the modulated signal and carries out processing operations including storage of the signals to output a 16-bit digital output at regular intervals. The digital filter may receive a reset instruction from a controller, which instruction causes clearing of the memory so that it is ready to process for the next output. This typically causes a delay of approximately 0.1 second.

Figure 2:
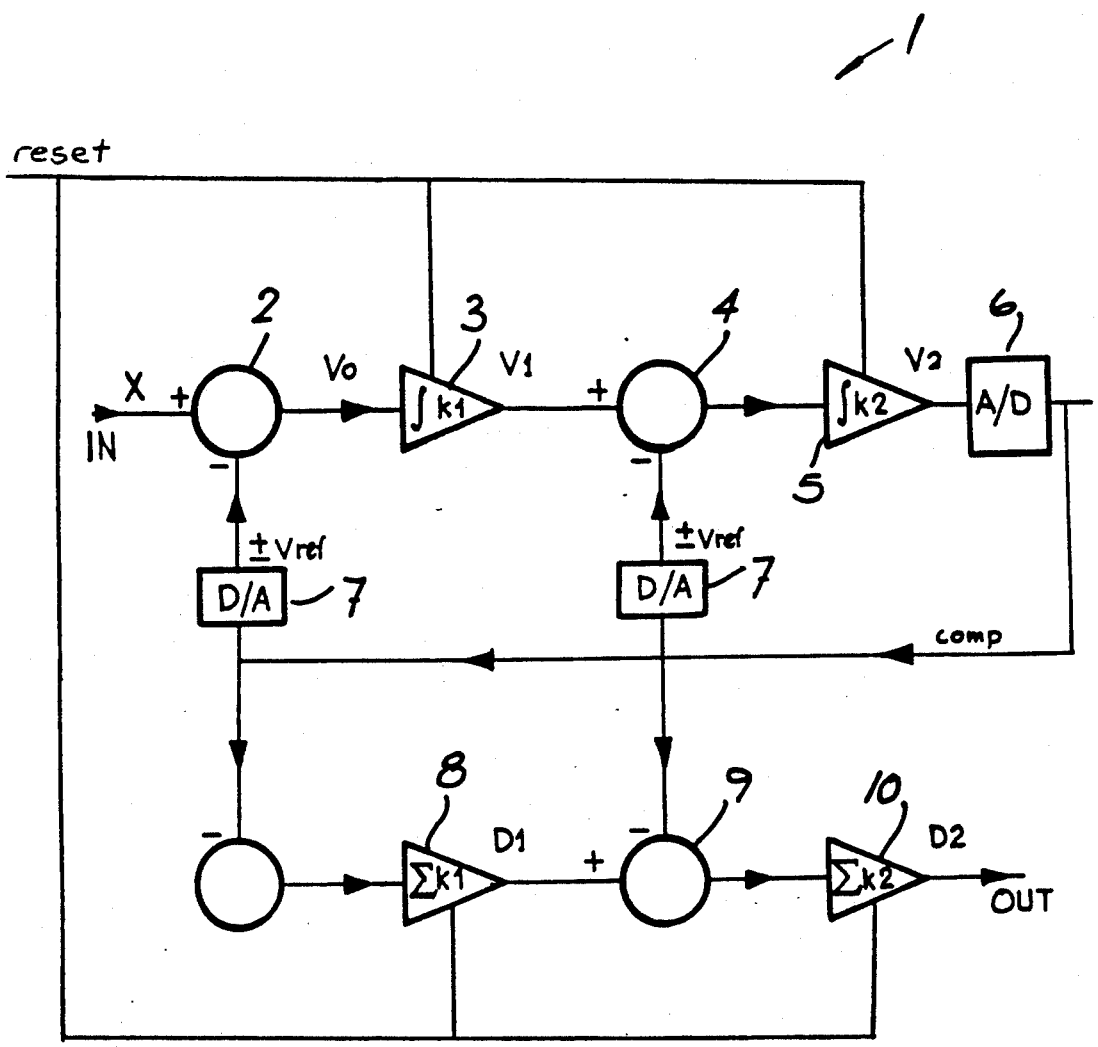
FIG. 2 is a diagram of a converter of the invention.

Referring now to FIG. 2, there is illustrated a sigma-delta analog to digital converter of the invention, indicated generally by the reference numeral 1. The converter 1 is of the second order type and includes a reset circuit. The analog modulator comprises a first analog summing junction 2 connected to a first analog integrator 3 which is in turn connected to a second analog summing junction 4, the output of which feeds a second analog integrator 5. The analog integrators 3 and 5 are each of the switched capacitor type. The output of the second analog integrator 5 is connected to a comparator 6 which outputs a serial digital modulated signal at a bit rate corresponding to the over-sampling frequency, which digital signal is referred to as "comp". The analog modulator is completed by a pair of D/A converters 7, each of which is connected for delivering a reference voltage of $+/- V_{ref}$ to the first and second analog summing junctions 2 and 4.

The digital filter comprises a first digital integrator 8 connected to a digital summing junction 9, the output of which is connected to a second digital integrator 10. The comparator 6 output which provides the negative feedback for the analog modulator is connected directly to the first digital integrator 8 and is also connected to the input of the digital summing junction 9. The digital integrators 8 and 10 each include a reset circuit.

In operation, the analog modulator over-samples the input analog signal X at a relatively high clock cycle rate say 254 kHz. The modulated signal "comp" is fed back to the analog summing junctions 2 and 4 as a plus or minus negative feedback reference voltage $V_{ref}$. The purpose of the feedback is to ensure that the outputs V1 and V2 of the analog integrators 3 and 5 are kept small. The gains k1 and k2 of the analog integrators are chosen to ensure that V1 and V2 are always less than $+/- V_{ref}$.

At the start of conversion, V1 and V2 are set to zero as are the outputs D1 and D2 of the digital integrators 8 and 10. Referring to equations (a) to (d) below, it will be seen that D2 is a function of D1 and the negative feedback, "comp". D1 is in turn a function of the negative feedback "comp". Because the converter 1 is of the second order type, the gains k1 and k2 are each chosen to be 0.5 The equations (e) to (f) are derived from merging the equations (a) to (d). As will be seen in equation (j) the input analog signal X can be equated to a known function of V2, D2, $V_{ref}$, k1 and k2. As V2 is within the range of $+/- V_{ref}$, this can be ignored and D2 may be regarded as a digital representation of X with a maximum error of V2 divided by the denominator of equation (j). This error is derived from a sum of sums of a constant and for n steps, and thus for n clock cycles, the sum of sums is $n(n-1)/2$. Thus, for any clock cycle n, X is known to an accuracy of $V2/[k1.k2(n-1)n]$. For 12-bit accuracy 128 samples are required and for 16-bit accuracy 512 samples would be required.

$$V1 = k1*\Sigma*(X - comp*V\_ref) \quad (a)$$
$$V2 = k2*\Sigma(V1 - comp*V\_ref) \quad (b)$$
$$D1 = k1*\Sigma(-comp) \quad (c)$$
$$D2 = k2*\Sigma(D1 - comp) \quad (d)$$
$$V2 = k2*\Sigma(k1*\Sigma(X - comp*V\_ref) - comp*V ref) \quad (e)$$
$$= k2*k1*\Sigma\Sigma X - k2*k1*\Sigma\Sigma comp*V\_ref - k2*\Sigma comp*V\_ref \quad (f)$$

$$D2 = k2*\Sigma(k1*\Sigma(-comp) - comp) \quad (g)$$
$$= -k2*k1*\Sigma\Sigma comp - k2*\Sigma comp \quad (h)$$
$$=> V2 = k2*k1*\Sigma\Sigma X + D2*V\_ref \quad (i)$$
$$=> X = \frac{V2 - D2*V ref}{k1*k2*\Sigma\Sigma} \quad (j)$$

If for example, the input analog signal X is kept between $+/- 0.5$ V and $V_{ref}$ is 1.0 V, for 128 samples the digital estimate of the input will have a maximum error of 0.246 mV.

It will be appreciated that because of use of the digital integrators 8 and 10 and the manner in which they are connected, these integrators process the feedback signal "comp" in the same manner as the analog integrators 3 and 5 process this feedback signal. Thus, the digital filter replicates processing of the feedback signal by the analog modulator. Accordingly, the digital filter and the analog modulator work in synchronism (in parallel) and accordingly when reset instructions are simultaneously received from a controller through a link both the analog modulator and the digital filter may be reset simultaneously by their reset circuits. This would occur once for each output signal, giving a conversion cycle and single shot operation. Thus, there is no delay between conversion cycles. This is particularly important, for example, in control applications where many different signals are being monitored with the aid, for example of a multiplexer. Another advantage is that because the feedback signal is a good representation of X and this is processed in the same manner as in the analog modulator, good accuracy is achieved. It will further be appreciated that the digital filter is of simple construction and may be easily integrated onto an integrated circuit. This will considerably reduce manufacturing costs.

Figure 3:
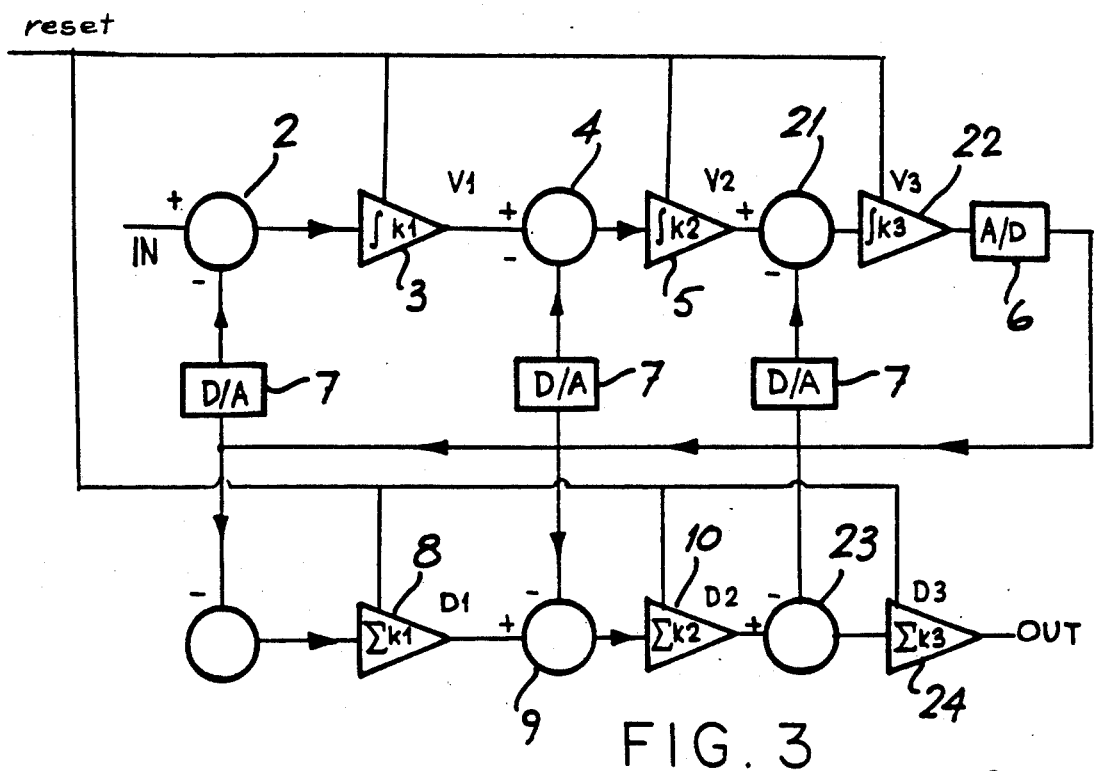
FIGS. 3, 4 and 5 are diagrams showing various alternative constructions of the converter of the invention.

The invention is not limited to the embodiment illustrated in FIG. 2. For example, referring now to FIG. 3 there is illustrated an alternative construction of converter, indicated generally by the reference numeral 20. Parts similar to those described with reference to FIG. 2 are identified by the same reference numerals. The converter 20 is of the third order type including a third analog summing junction 21 and a third analog integrator 22. The digital filter includes a corresponding third digital summing junction 23 and a third digital integrator 24. Thus, again the digital filter may replicate processing of the feedback signal so that it may be reset together with the analog modulator once per conversion cycle. Needless to say, the converter of the invention may be of any order, including single order. It has been found that if processing of the feedback signal in only some of the analog integrators beginning with the first is replicated in the digital filter, single shot operation is still achieved, although accuracy is disimproved. Accordingly, it is not necessary that there be a digital integrator corresponding to each analog integrator, however, this is the preferred construction.

Figure 4:
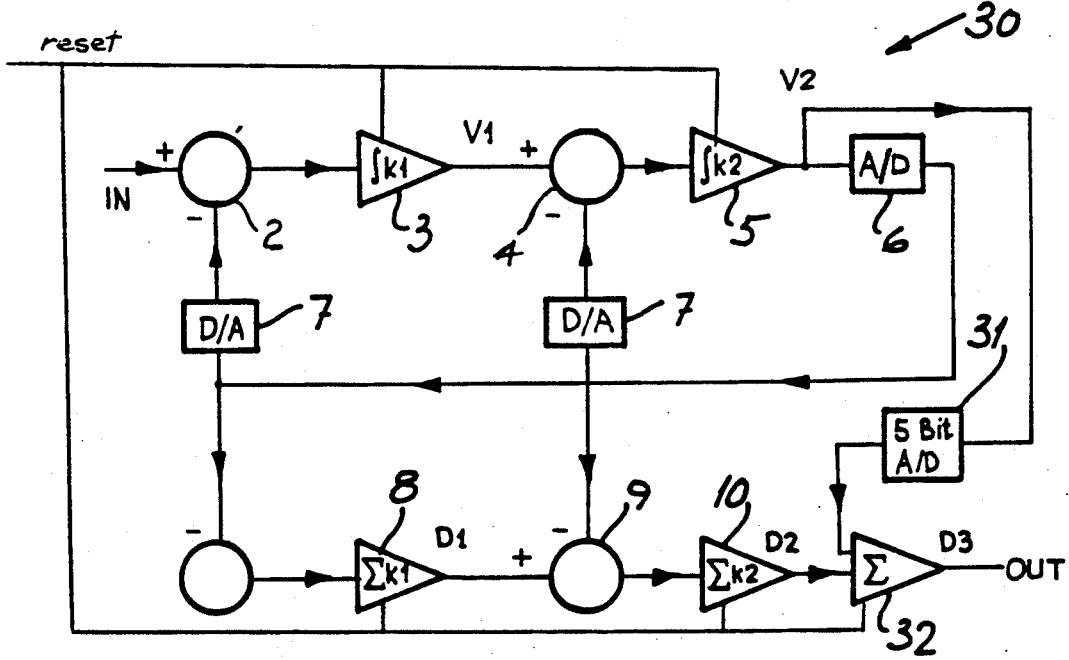

Referring now to FIG. 4 there is illustrated an alternative second order converter of the invention, indicated generally by the reference numeral 30. Again, parts similar to those described with reference to the previous drawings are identified by the same reference numerals. The converter 30 includes an auxiliary A/D converter 31 for 5-bit conversion. The converter 31 is connected at the output of the second analog integrator 5 for evaluation of V2 at the end of each conversion cycle. Referring again to equation (j), the residual caused by the presence of V2 in the integrator may be reduced by 5-bit calculation of the value of V2 at the end of the conversion cycle. This will allow an extra 4-bits of resolution of X and 16-bit conversion accuracy in 128 clock cycles. The converter 31 is connected to an auxiliary digital integrator 32 connected at the output of the second digital integrator 10, the digital output being D3. It will be appreciated that this arrangement provides for significantly improved accuracy.

Figure 5:
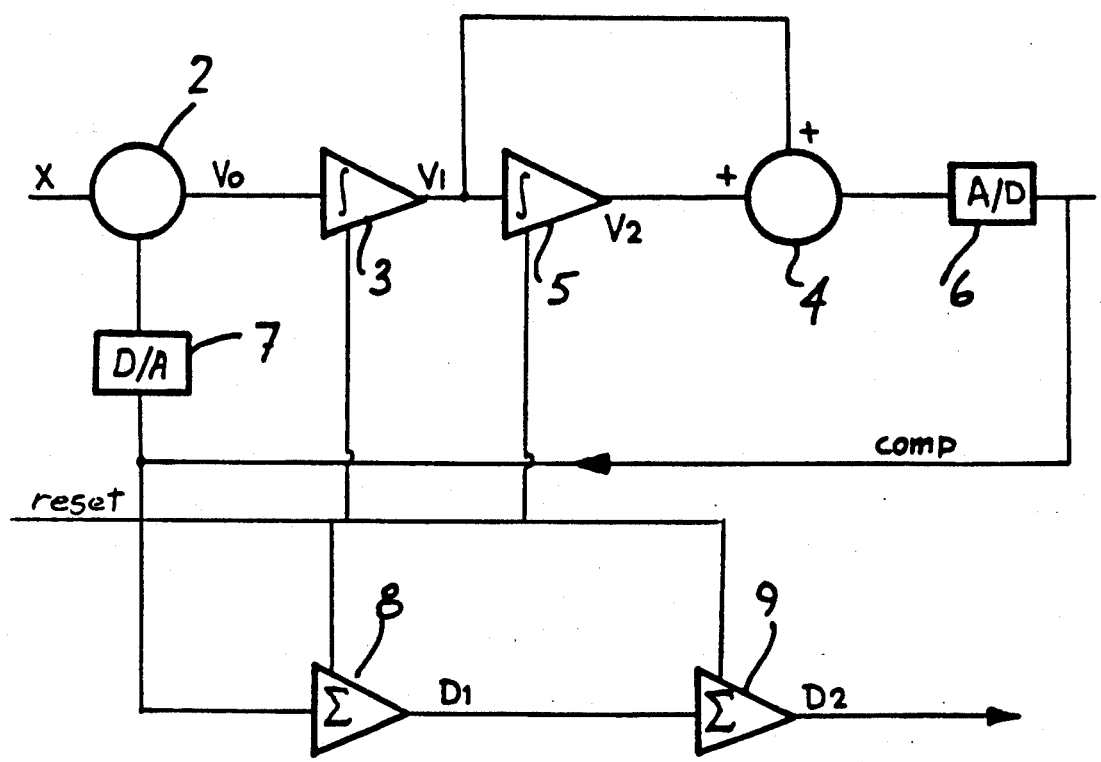

The invention may be applied to any type of sigma-delta converter, for example, referring to FIG. 5, there is illustrated an implementation of the invention with a sigma-delta analog to digital converter of the "feed forward" type. It will be seen from the equations below that the digital value $D_2$ is proportional to X to a good accuracy. Again, the digital integrators 8 and 9 mirror processing of the feedback signal "comp" by the analog integrators 3 and 5 and so when reset instructions are received they will simultaneously reset at the start of each conversion cycle.

$$-V_0 = X - comp$$
$$V_1 = \Sigma(V_0) = \Sigma(X - comp)$$
$$V_2 = \Sigma V_1 = \Sigma\Sigma(X - comp)$$
$$= \Sigma\Sigma X - \Sigma\Sigma comp$$

$$D_2 = \Sigma\Sigma comp$$
$$\Rightarrow V_2 = \Sigma\Sigma X - D_2$$
$$\text{as } (V_2) << \Sigma\Sigma X, \quad D_2 \approx \Sigma\Sigma X$$

after n clock cycles $\Sigma\Sigma X =$ $$\frac{n(n-1)}{2} X$$

$$\Rightarrow D_2 \, \alpha \, X-$$

The invention is not limited to the embodiments hereinbefore described, for example, it is envisaged that the feedback signal of the analog modulator may be multi-bit instead of single bit. It is also envisaged that the digital filter may not include digital integrators. Instead, a processing circuit together with look-up tables may be used in order to replicate processing of the feedback signal by the analog integrators. It is envisaged that there are many ways in which this could be carried out in software. The important point of the invention is that the digital filter replicates processing by the analog modulator of the feedback signal and that when reset instructions are received the analog modulator and the digital filter reset simultaneously. It is envisaged that the analog modulator may only sample for portion of the clock cycles in a conversion cycle, which may improve stability.

I claim:

1. A sigma-delta analog to digital converter comprising:
    an analog signal input port;
    a digital signal output port;
    an analog modulator connected to the input port for generation of a digital modulated signal, the analog modulator comprising:
    a loop in which an analog filter is connected comprising a series of analog integrators, each of said analog integrators having a reset circuit;
    a comparator connected in the loop; and
    a feedback path for said digital modulated signal connected to the comparator;
    a digital filter for generating an output digital signal, the digital filter being connected to the feedback path, having a frequency response matching that of the analog filter, having a reset means, and having a digital filter output directly connected to the digital signal output port for delivery of the output digital signal; and
    a link interconnecting the reset circuits of the analog modulator and the reset means of the digital filter.

2. A converter as claimed in claim 1, wherein the digital filter comprises a digital integrator for each of said analog integrators.

3. A converter as claimed in claim 2, wherein said digital integrators are interconnected in a manner which matches interconnection of the analog integrators.

4. A converter as claimed in claim 2, wherein said digital filter further comprises at least one additional digital integrator, said at least one additional digital integrator being connected in cascade format at the digital filter output.

5. A converter as claimed in claim 4, further comprising an auxiliary mult-bit analog to digital converter having an input connected to a last analog integrator in said series of analog integrators, and an output connected as an auxiliary input to said at least one additional digital integrator.

6. A method of carrying out single shot analog to digital conversion in a sigma-delta analog to digital converter comprising an analog modulator having an analog filter, a comparator and a feedback path, and a digital filter, the method comprising the steps of:
    simultaneously resetting both the analog filter and the digital filter;
    the analog filter successively over-sampling an input analog signal in a serial manner to generate a sampling signal;
    the comparator subsequently comparing the sampling signal with a reference signal to provide a digital modulated signal;
    the feedback path inputting the digital modulated signal to the digital filter;
    filtering the digital modulated signal at the digital filter in a manner which matches the frequency response of the analog filter; and
    outputting a digital signal from the digital filter at the end of a conversion cycle which comprises a fixed number of clock cycles.

7. A method as claimed in claim 6, wherein said step of over-sampling the input analog signal lasts for only a portion of the conversion cycle.

* * * * *